(12) United States Patent
Kim

(10) Patent No.: US 9,859,428 B1
(45) Date of Patent: Jan. 2, 2018

(54) SEMICONDUCTOR DEVICE AND METHOD OF MANUFACTURING THE SAME

(71) Applicant: SK hynix Inc., Icheon-si Gyeonggi-do (KR)

(72) Inventor: Jin Ha Kim, Icheon-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/402,350

(22) Filed: Jan. 10, 2017

(30) Foreign Application Priority Data

Aug. 9, 2016 (KR) ........................ 10-2016-0101286

(51) Int. Cl.
| | | |
|---|---|---|
| *H01L 29/76* | (2006.01) | |
| *H01L 29/78* | (2006.01) | |
| *H01L 21/324* | (2006.01) | |
| *H01L 29/788* | (2006.01) | |
| *H01L 29/792* | (2006.01) | |
| *H01L 29/10* | (2006.01) | |
| *H01L 27/11556* | (2017.01) | |
| *H01L 27/11582* | (2017.01) | |

(52) U.S. Cl.
CPC ........ *H01L 29/7849* (2013.01); *H01L 21/324* (2013.01); *H01L 27/11556* (2013.01); *H01L 27/11582* (2013.01); *H01L 29/1054* (2013.01); *H01L 29/788* (2013.01); *H01L 29/792* (2013.01)

(58) Field of Classification Search
CPC ........................ H01L 29/7842; H01L 29/1054
USPC ........................................................ 257/314
See application file for complete search history.

(56) References Cited

U.S. PATENT DOCUMENTS

2012/0104484 A1* 5/2012 Lee .................. H01L 27/11582
257/324

FOREIGN PATENT DOCUMENTS

| KR | 100839359 B1 | 6/2008 |
|---|---|---|
| KR | 1020090023615 A | 3/2009 |
| KR | 1020140035084 A | 3/2014 |
| KR | 1020140040515 A | 4/2014 |

\* cited by examiner

*Primary Examiner* — David Vu
*Assistant Examiner* — Brandon Fox
(74) *Attorney, Agent, or Firm* — William Park & Associates Ltd.

(57) ABSTRACT

A semiconductor memory device includes a stacked structure including conductive layers and insulating layers alternately stacked, a strained channel layer passing through the stacked structure, a stressor layer contacting the strained channel layer and applying stress to the strained channel layer, and a core layer formed in the stressor layer.

13 Claims, 5 Drawing Sheets

SEMICONDUCTOR DEVICE AND METHOD OF MANUFACTURING THE SAME

CROSS-REFERENCE TO RELATED APPLICATION

The present application claims priority under 35 U.S.C §119(a) to Korean patent application 10-2016-0101286 filed on Aug. 9, 2016 in the Korean Intellectual Property Office, the entire disclosure of which is incorporated by reference herein.

BACKGROUND

1. Technical Field

An aspect of the disclosure relates to an electronic device and a manufacturing method thereof, and more particularly, to a three-dimensional semiconductor device and a manufacturing method thereof.

2. Related Art

A non-volatile memory device maintains stored data as even though power supply may be disconnected. Recently, as limits are reached in the improvement of an integration of a two-dimensional non-volatile memory device that forms a memory cell in a single layer on a substrate, a three-dimensional non-volatile memory device consisting of memory cells stacked perpendicular to the substrate has been proposed.

The three-dimensional non-volatile memory device includes interlayer insulating layers and gate electrodes alternately stacked with channel layers passing through the device, and memory cells are stacked along the channel layers. Various structures and manufacturing methods have been developed for the purpose of improving the operational reliability of a non-volatile memory device having such a three-dimensional structure.

SUMMARY

Various embodiments relate to a semiconductor device having a stable structure and improved characteristics with an easy manufacturing process and a manufacturing method thereof.

According to an aspect of the disclosure, there is provided a semiconductor device including a stacked structure including conductive layers and insulating layers alternately stacked, a strained channel layer passing through the stacked structure, a stressor layer contacting the strained channel layer and applying stress to the strained channel layer, and a core layer formed in the stressor layer.

According to an aspect of the disclosure, there is provided a semiconductor device including a stacked structure, a stressor layer passing through the stacked structure, a strained channel layer surrounding an outer surface of the stressor layer and having a different thermal expansion coefficient than the stressor layer, and a memory layer surrounding an outer surface of the strained channel layer.

According to an aspect of the disclosure, there is provided a manufacturing method of a semiconductor device, the method including alternately forming first material layers and second material layers, forming an opening passing through the first and second material layers, forming a channel layer in the opening, forming a stressor layer in the channel layer, and forming a strained channel layer by performing heat treatment of the stressor layer and the channel layer.

DETAILED DESCRIPTION

Figure 1:
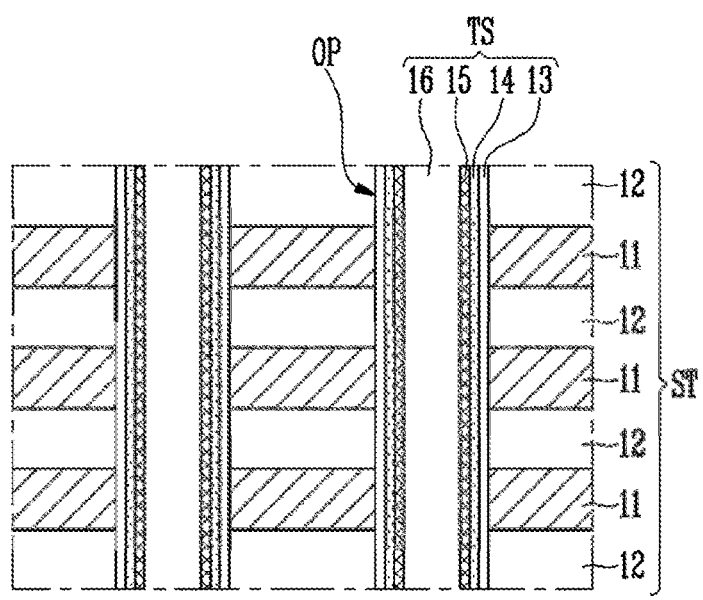
FIG. 1 is a cross-sectional diagram illustrating a structure of a semiconductor device according to an embodiment of the present disclosure.

Hereinafter, embodiments of the disclosure will be described with reference to the accompanying drawings. A thickness and spacing are presented for convenience of explanation, and could be exaggerated compared to an actual physical thickness. In the following description, a configuration which is publicly known but irrelevant to the gist of the present disclosure could be omitted. In addition, with regard to adding the reference numerals to constituent elements of each drawing, it should be noted that like reference numerals in the drawings denote like elements even though shown on the other drawings.

FIG. 1 is a cross-sectional diagram illustrating a structure of a semiconductor memory device according to an embodiment of the present disclosure. It should be noted that the drawing focuses on an area in which a memory cell is formed and illustrations of the remaining areas are omitted.

Referring to FIG. 1, a semiconductor memory device according to an embodiment of the present disclosure may include a stacked structure ST and a through structure TS passing through the stacked structure ST. The stacked structure ST and the through structure TS may be configured to form memory strings including stacked memory cells. The memory strings may be arranged perpendicular to a substrate or positioned in a U shape or a W shape, etc. Although not shown in the drawings, a source structure, a peripheral circuit and the like may be arranged under the stacked structure ST.

The stacked structure ST may include conductive layers 11 and insulating layers 12 which are alternately stacked. The conductive layers 11 may be gate electrodes of a memory cell, a selection transistor and the like and the insulating layers 12 may insulate the stacked conductive layers 11 from one another. For example, at least one uppermost conductive layer 11 of the stacked conductive layers 11 may be a gate electrode of a drain selection transistor, at least one lowermost conductive layer 11 may be a gate electrode of a source selection transistor, and the remaining conductive layers 11 may be gate electrodes of memory cells. In another example, at least one uppermost conductive layer 11 of the stacked conductive layers 11 may be a gate electrode of a selection transistor, at least one lowermost conductive layer 11 may be a gate electrode of a pipe transistor, and the remaining conductive layers 11 may be the gate electrodes of the memory cells.

The through structure TS may be arranged in an opening OP passing through the stacked structure ST in a stacking direction. The through structure TS may include a memory layer 13, a strained channel layer 14, a stressor layer 15, and a core layer 16.

The strained channel layer 14 may provide a current path when driving the memory cell, the selection transistor, etc. The stressor layer 15 may form the strained channel layer 14 by applying tensile stress to a channel layer (see a channel layer 24 of FIG. 2B, for example). Thus, the stressor layer 15 may apply tensile stress to the strained channel layer 14, and the strained channel layer 14 and the stressor layer 15 may pass through the stacked structure ST. The strained channel layer 14 and the stressor layer 15 may have different thermal expansion coefficients from each other. For example, the strained channel layer 14 may include a semiconductor material and may be a polysilicon layer. In addition, the stressor layer 15 may include a material that may produce the tensile stress. For example, the stressor layer 15 may include a nitride such as SiN.

The strained channel layer 14 may be a channel layer with characteristics modified by stress from the stressor layer 15. The strained channel layer 14 may have a higher carrier mobility than a channel layer to which stress is not applied. For example, the strained channel layer 14 to which a tensile stress is applied may have higher electron mobility compared to the channel layer consisting of the polysilicon layer. Therefore, the intensity of current flowing through the strained channel layer 14 may be prevented from being reduced in spite of the increase in the number of stacked memory cells.

In addition, in order to efficiently transmit the tensile stress from the stressor layer 15 to the strained channel layer 14, the stressor layer 15 and the strained channel layer 14 may be arranged to contact each other. For example, the strained channel layer 14 may have an opened central area and the stressor layer 15 may be arranged to directly contact an inner wall of the strained channel layer 14. Alternatively, the strained channel layer 14 may surround an outer surface of the stressor layer 15, so that the outer surface of the stressor layer 15 and an inner surface of the strained channel layer 14 may directly contact each other.

The core layer 16 may be formed in the stressor layer 15. For example, the stressor layer 15 may have an opened central area, and the core layer 16 may be formed in the opened central area. The core layer 16 may include an insulating material such as an oxide. For example, the core layer 16 may include polysilazane.

The memory layer 13 may be disposed between the strained channel layer 14 and the conductive layers 11, and include at least one of a tunnel insulating layer, a data storing layer, and a charge blocking layer. The data storing layer may include a floating gate such as polysilicon, or a charge trap material such as a nitride, a phase change material, nano-dots, etc. For reference, the memory layer 13 may be disposed between the strained channel layer 14 and the conductive layers 11 and between the strained channel layer 14 and the insulating layer 12, thereby surrounding the outer surface of the strained channel layer 14. Further, the memory layer 13 may be disposed between the strained channel layer 14 and the conductive layers 11, and between the conductive layers 11 and the insulating layers 12, thereby surrounding each of the conductive layers 11.

In accordance with the structure as described above, the stacked memory cells and the selection transistors may include the strained channel layer 14. Accordingly, characteristics of the semiconductor device may be improved by improving the carrier mobility, which is one of the unique characteristics of the channel layer, without modifying a physical dimension of the semiconductor device.

FIGS. 2A to 2D are cross-sectional diagrams illustrating a manufacturing method of a semiconductor device according to an embodiment of the present disclosure.

Figure 2A:
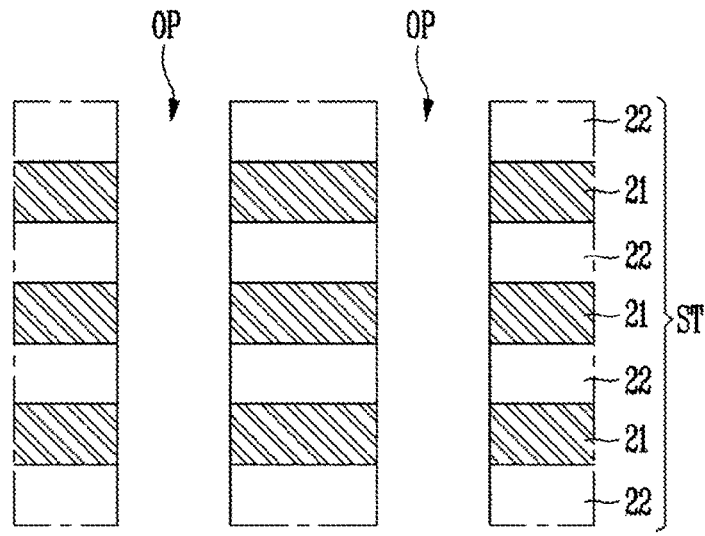
FIGS. 2A to 2D are cross-sectional diagrams illustrating a manufacturing method of a semiconductor device according to an embodiment of the present disclosure.

Referring to FIG. 2A, the stacked structure ST including first material layers 21 and second material layers 22 alternately stacked is formed. For example, the stacked structure is formed by alternately forming the first material layers 21 and the second material layers 22. The first material layers 21 is for forming the gate electrodes of a memory cell, a selection transistor, and the like and the second material layers 22 is for forming an insulating layer for insulating the stacked gate electrodes from one another.

The first material layers 21 may be formed of a material with a higher etch selectivity with respect to the second material layers 22. For example, each of the first material layers 21 may be a sacrificial layer including a nitride, etc. and each of the second material layers 22 may be an insulating layer including an oxide, etc. In another example, each of the first material layers 21 may be a conductive layer including doped polysilicon, and each of the second material layers 22 may be a sacrificial layer including undoped polysilicon.

Subsequently, the openings OP passing through the stacked structure ST may be formed. The openings OP may pass through the stacked structure ST to a depth to which a source structure under the stacked structure is exposed. In addition, the openings OP may have cross sections in a circular shape, an oval shape, a square shape, a polygonal shape, etc.

Figure 2B:
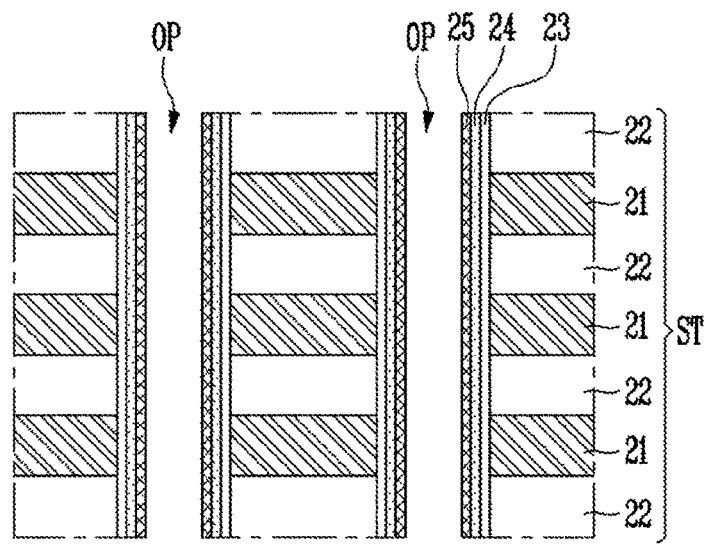

Referring to FIG. 2B, a memory layer 23, a channel layer 24, and a stressor layer 25 may be sequentially formed in each of the openings OP. The memory layer 23, the channel layer 24, and the stressor layer 25 may be formed having a uniform thickness along inner walls of the openings OP. In addition, the memory layer 23, the channel layer 24, and the stressor layer 25 may not completely fill the openings OP.

The memory layer 23 may include at least one of the charge blocking layer, the data storing layer, and the tunnel insulating layer. The data storing layer may include a floating gate such as polysilicon, a charge trap material such as a nitride, a phase change material, nano-dots, etc. For example, the channel layer 24 may be an amorphous silicon layer. The stressor layer 25 may be formed in the channel layer 24. The stressor layer 25 may include a material that may produce tensile stress. For example, the stressor layer 25 may include a nitride such as SiN. The stressor layer 25 may be formed of a material having a different thermal expansion coefficient than the channel layer 24. In addition, the stressor layer 25 may be formed by using a method such as chemical vapor deposition (CVD), atomic layer deposition and the like.

Figure 2C:
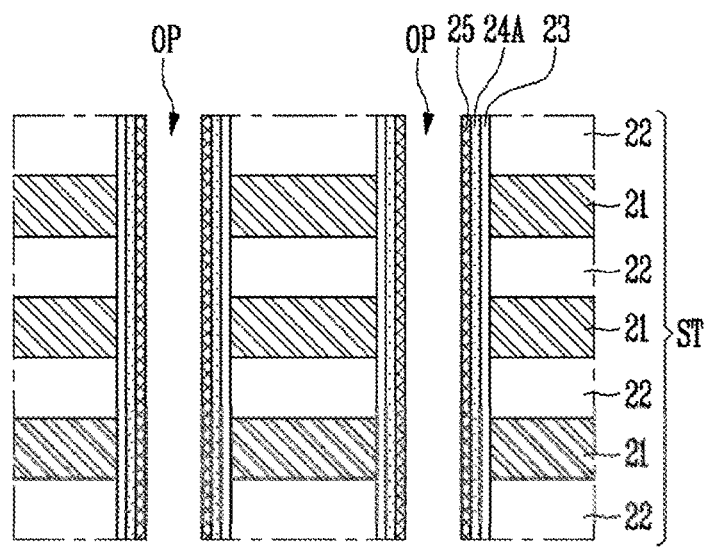

Referring to FIG. 2C, a strained channel layer 24A may be formed by performing a heat treatment process on, for example, the stressor layer 25 and the channel layer 24. During the process, the entire area of the stressor layer 25 may be uniformly heat treated by heat treating the stressor layer 25 through the opening OP. When the heat is applied to the stressor layer 25, tensile stress may be induced in the stressor layer 25. In addition, as the stressor layer 25 and the channel layer 24 directly contact each other, the tensile stress of the stressor layer 25 may be transmitted to the channel layer 24. Thus, the tensile stress of the strained channel layer 24A may be induced by tensile stress of the stressor layer 25. Accordingly, tensile stress may be induced in the channel layer 24, so that the strained channel layer 24A may be formed. As a result, the electron mobility of the channel layer 24 may increase and the strained channel layer 24A having higher electron mobility is formed.

In addition, the channel layer 24 may be crystallized during the heat treatment process. When the channel layer 24 is formed of the amorphous silicon layer, the amorphous silicon layer may be crystallized as the polysilicon layer by performing the heat treatment process. The heat treatment process may be performed at 400 (four hundred) degrees Celsius to 800 (eight hundred) degrees Celsius for 2 (two) hours to 6 (six) hours. For example, the heat treatment process may be performed at 600 (six hundred) degrees Celsius for 4 (four) hours.

Figure 2D:
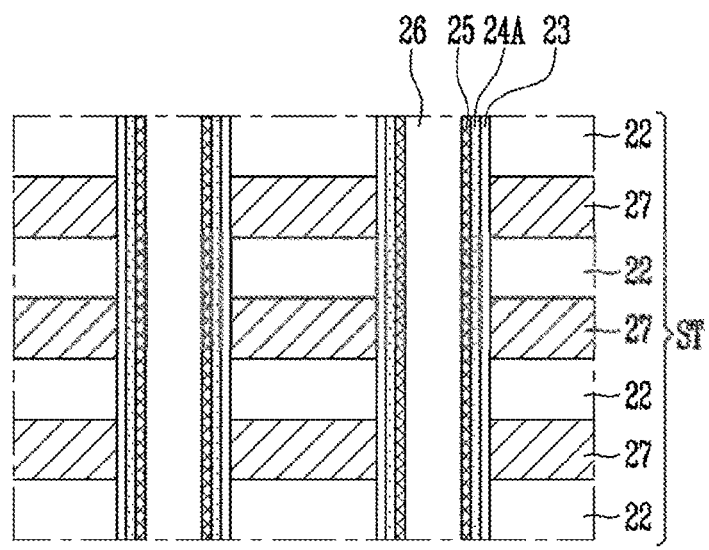

Referring to FIG. 2D, a core layer 26 may be formed in the stressor layer 25 after, for example, forming the strained channel layer 24A. The core layer 26 may be an insulating layer including polysilazane (PSZ), etc. and have an air gap therein.

After forming a slit (not shown) passing through the stacked structure ST, the first material layers 21 or the second material layers 22 may be replaced with third material layers 27 through the slit. For example, when the first material layers 21 are sacrificial layers and the second material layers 22 are insulating layers, the first material layers 21 may be replaced with conductive layers including metal such as tungsten (W). In another example, when each of the first material layers 21 is a conductive layer such as a polysilicon layer and each of the second material layers 22 is an insulating layer, the first material layers 21 may be silicided. In another example, when the first material layers 21 are conductive layers and the second material layers 22 are sacrificial layers, the second material layers 22 may be replaced with insulating layers.

In accordance with the manufacturing method described above, the strained channel layer 24A may be formed by applying tensile stress to the channel layer 24 through the stressor layer 25. Specifically, the strained channel layer 24A with an improved electron mobility may be formed by concurrently crystallizing the channel layer 24 and applying a tensile stress to the channel layer 24 by performing the heat treatment process.

Figure 3:
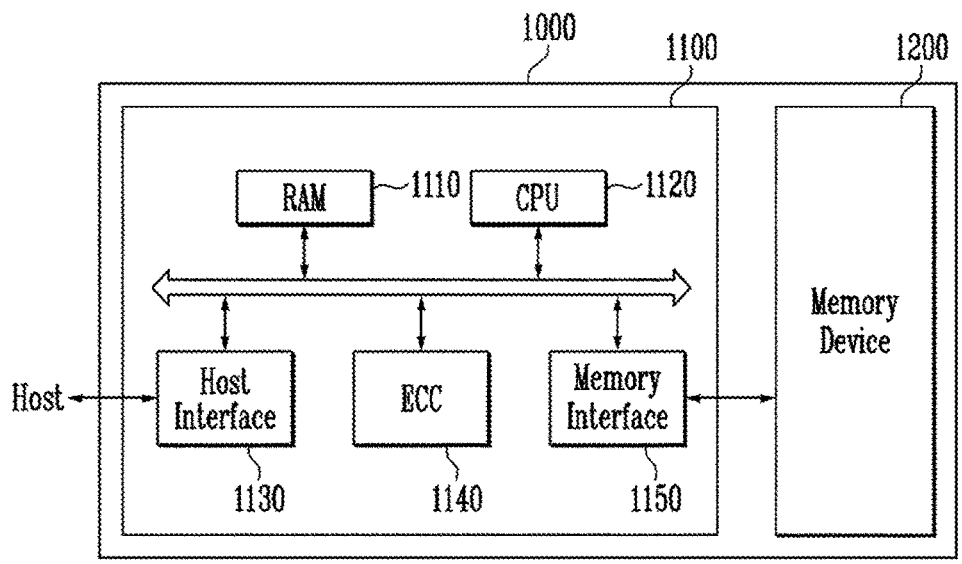
FIG. 3 is a block diagram illustrating a configuration of a memory system according to an embodiment of the present disclosure.

FIG. 3 is a block diagram illustrating a configuration of a memory system according to an embodiment of the present disclosure.

Referring to FIG. 3, a memory system 1000 according to an embodiment of the present disclosure may include a memory device 1200 and a controller 1100.

The memory device 1200 may be used for storing data information having various data shapes, for example, text, graphic, software code, etc. The memory device 1200 may be the non-volatile memory and have the structure described above in reference to FIGS. 1 to 2D. In addition, the memory device 1200 may include a stacked structure including conductive layers and insulating layers alternately stacked, a strained channel layer passing through the stacked structure, a stressor layer contacting the strained channel layer and applying tensile stress to the strained channel layer, and a core layer formed in the stressor layer. The structure and the manufacturing method of the memory device 1200 may be the same as the above. Thus, detailed description thereof will be omitted to avoid redundancy.

The controller 1100 may be connected to a host and the memory device 1200, and configured to access the memory device 1200 in response to a request from the host. For example, the controller 1100 may be configured to control a read operation, a write operation, a delete operation, a background operation and the like of the memory device 1200.

The controller 1100 may include a random access memory (RAM, 1110), a central processing unit (CPU, 1120), a host interface (1130), an error correction code circuit (ECC, 1140), a memory interface (1150), etc.

The RAM 1110 may be used for an operation memory of the CPU 1120, a cache memory between the memory device 1200 and the host, and a buffer memory between the memory device 1200 and the host. For reference, the RAM 1110 may be replaced with a static random access memory (SRAM), a read only memory (ROM), etc.

The CPU 1120 may be configured to control an overall operation of the controller 1100. For example, the CPU 1120 may be configured to operate firmware such as a flash translation layer (FTL) stored in the RAM 1110.

The host interface 1130 may be configured to perform interfacing with the host. For example, the controller 1100 may communicate with the host through at least one of various interface protocols such as a universal serial bus protocol (USB), a multimedia card protocol (MMC), a peripheral component interconnection protocol (PCI), a PCI-express protocol (PCI-E), an advanced technology attachment protocol (ATA), a serial-ATA protocol, a parallel-ATA protocol, a small computer small interface protocol (SCSI), an enhanced small disk interface protocol (ESDI), an integrated drive electronics protocol (IDE), and a private protocol.

The ECC circuit 1140 may be configured to detect and correct an error included in data read from the memory device 1200 by using the error correction code ECC.

The memory interface 1150 may be configured to perform interfacing with the memory device 1200. For example, the memory interface 1150 may include a NAND interface or a NOR interface.

For reference, the controller 1100 may further include a buffer memory (not shown) for temporarily storing the data. The buffer memory may be used for temporarily storing the data transmitted to the external source through the host interface 1130 or the data transmitted from the memory device 1200 through the memory interface 1150. In addition, the controller 1100 may further include the ROM that stores code data for interfacing with the host.

As such, the memory system 1000 according to an embodiment of the present disclosure may include the memory device 1200 with improved integration and characteristics. As a result, the integration and characteristics of the memory system 1000 may be improved.

Figure 4:
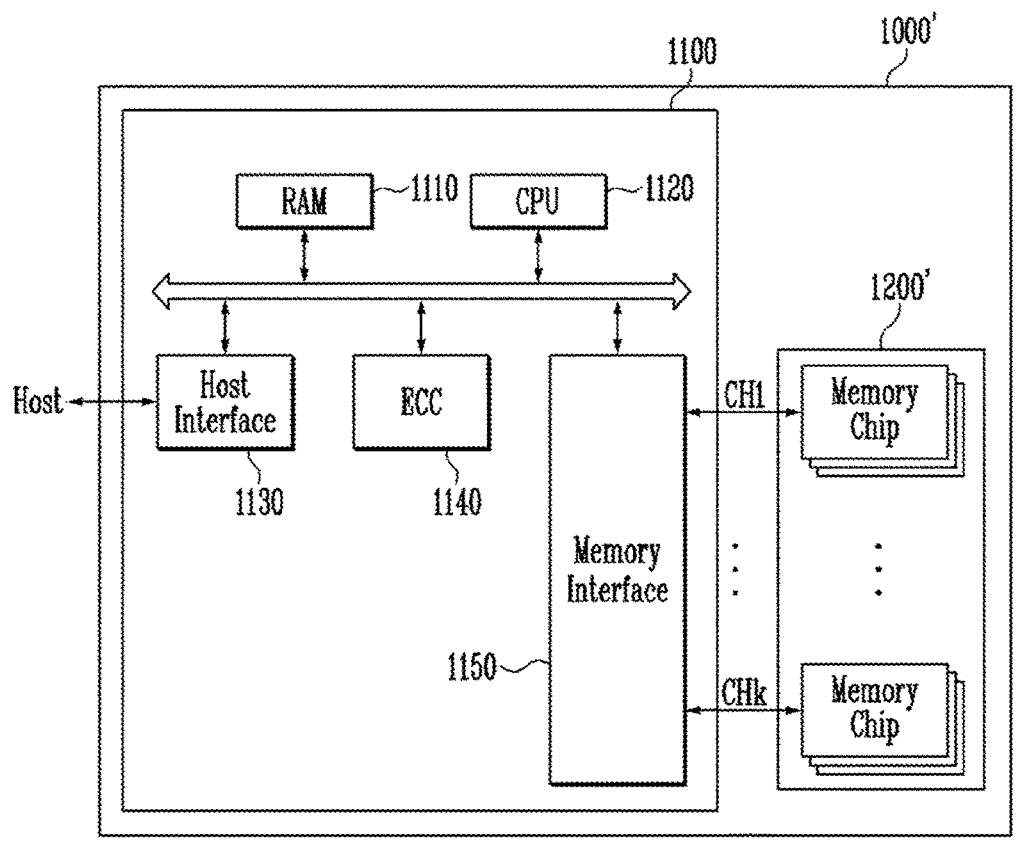
FIG. 4 is a block diagram illustrating a configuration of a memory system according to an embodiment of the present disclosure.

FIG. 4 is a block diagram illustrating a configuration of a memory system according to an embodiment of the present disclosure. Hereafter, repeated description will be omitted to avoid redundancy.

Referring to FIG. 4, a memory system 1000' according to an embodiment of the present disclosure may include a memory device 1200' and the controller 1100. In addition, the controller 1100 may include the RAM 1110, the CPU 1120, the host interface 1130, the ECC circuit 1140, the memory interface 1150, etc.

The memory device 1200' may be the non-volatile memory and include the memory string described above in reference to FIGS. 1 to 2D. In addition, the memory device 1200' may be configured to include a stacked structure including conductive layers and insulating layers alternately stacked, a strained channel layer passing through the stacked structure, a stressor layer contacting the strained channel layer and applying tensile stress to the strained channel layer, and a core layer formed in the stressor layer. The structure and the manufacturing method of the memory device 1200' are the same as the description above. Thus, a detailed description thereof will be omitted to avoid redundancy.

In addition, the memory device 1200' may be a multi-chip package consisting of a plurality of memory chips. The plurality of memory chips may be divided into a plurality of groups, and the plurality of groups may be configured to communicate with the controller 1100 through a first channel to a kth channel (CH1 to CHk). Further, the memory chips included in a single group may be configured to communicate with the controller 1100 through a common channel. For reference, the memory system 1000' could be modified so that a single memory chip may be connected to a single channel.

As such, the memory system 1000' according to an embodiment of the present disclosure may include the memory device 1200' with improved integration and characteristics, so that the integration and characteristics of the memory system 1000' may be improved accordingly. Specifically, the memory device 1200' of the multi-chip package may increase data storage capacity and driving speed of the memory system 1000'.

Figure 5:
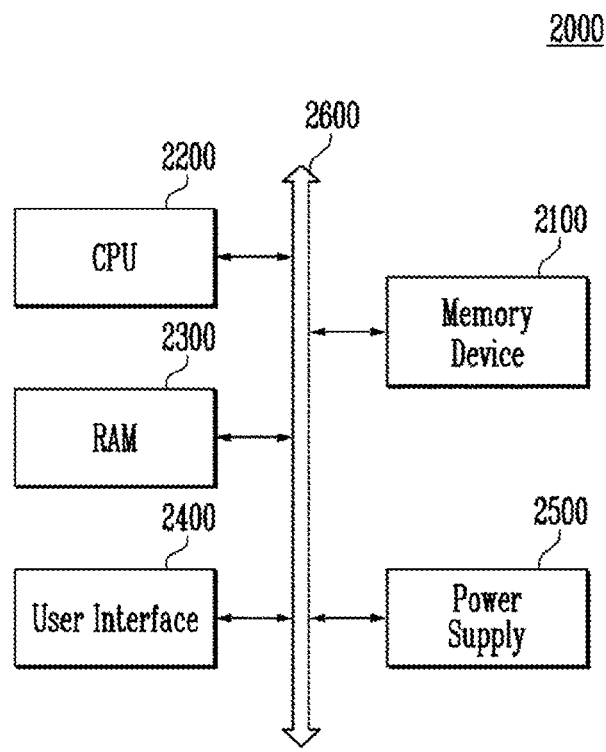
FIG. 5 is a block diagram illustrating a configuration of a computing system according to an embodiment of the present disclosure.

FIG. 5 is a block diagram illustrating a configuration of a computing system according to an embodiment of the present disclosure. Hereafter, repeated descriptions will be omitted to avoid redundancy.

Referring to FIG. 5, a computing system 2000 according to an embodiment of the present disclosure may include a memory device 2100, a CPU 2200, a RAM 2300, a user interface 2400, a power supply 2500, a system bus 2600, etc.

The memory device 2100 may store the data provided through the user interface 2400 and the data processed by the CPU 2200. In addition, the memory device 2100 may be electrically connected to the CPU 2200, the RAM 2300, the user interface 2400, the power supply 2500 and the like through the system bus 2600. For example, the memory device 2100 may be connected to the system bus 2600 through a controller (not shown), or directly connected to the system bus 2600. When the memory device 2100 is directly connected to the system bus 2600, functions of the controller may be performed by the CPU 2200, the RAM 2300 and the like.

The memory device 2100 may be a non-volatile memory and include a memory string as described above in reference to FIGS. 1 to 2D. In addition, the memory device 2100 may be configured to include a stacked structure including conductive layers and insulating layers alternately stacked, a strained channel layer passing through the stacked structure, a stressor layer contacting the strained channel layer and applying tensile stress to the strained channel layer, and a core layer formed in the stressor layer. The structure and the manufacturing method of the memory device 2100 are the same as the description above. Thus, a detailed description thereof will be omitted to avoid redundancy.

In addition, the memory device 2100 may be the multi-chip package consisting of the of memory chips as described in reference to FIG. 4.

The computing system 2000 having such a configuration may be provided as one of the various electronic devices constituting a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game set, a navigation device, a black box, a digital camera, a 3-dimensional television, a digital audio recorder, a digital audio player, a digital picture recorder, a digital picture player, a digital video recorder, a digital video player, a device which sends and receives information in a wireless environment, and a home network, one of the various electronic devices constituting a computer network, and one of the various electronic devices constituting a telematics network, an RFID device, and the like.

As such, the computing system 2000 according to an embodiment of the present disclosure may include the memory device 2100 with improved integration and characteristics. As a result, the characteristics of the computing system 2000 may be improved.

Figure 6:
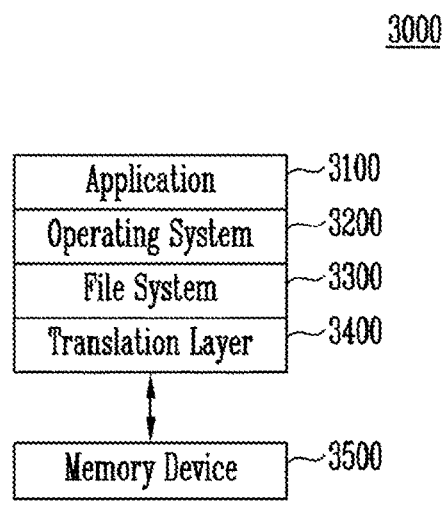
FIG. 6 is a block diagram illustrating a computing system according to an embodiment of the present disclosure.

FIG. 6 is a block diagram illustrating a computing system according to an embodiment of the present disclosure Referring to FIG. 6, a computing system 3000 according to an embodiment of the present disclosure may include an operating system 3200, an application 3100, a file system 3300, a translation layer 3400 and the like. In addition, the computing system 3000 may include a hardware layer such as a memory device 3500.

The operating system 3200 may manage software and hardware resources of the computing system 3000, and control program execution of a central processing unit. The application 3100 may be one of various application programs performed in the computing system 3000 and a utility performed by the operating system 3200.

The file system 3300 may indicate a logical structure for managing data and files in the computing system 3000 and structuralize the files and the data to be stored in the memory device 3500 in accordance with a rule. The file system 3300 may be determined depending on the operating system 3200 used in the computing system 3000. For example, when the operating system 3200 belongs to Microsoft Windows' series, the file system 3300 may be a file allocation table (FAT), an NT file system (NTFS) and the like. In addition, when the operating system 3200 belongs to Unix/Linux series, the file system 3300 may be an extended file system (EXT), a Unix file system (UFS), a journaling file system (JFS) and the like.

Although each of the operating system 3200, the application 3100, and the file system 3300 is illustrated as a separate block in the drawings, the application 3100 and the file system 3300 may be included in the operating system 3200.

The translation layer 3400 may convert an address to a suitable form for the memory device 3500 in response to a request from the file system 3300. For example, the translation layer 3400 may convert a logical address the file system 3300 generates to a physical address of the memory device 3500. Mapping information of the logical address and the physical address may be stored as an address translation table. For example, the translation layer 3400 may be a flash translation layer (FTL), a universal flash storage link layer (ULL), and the like.

The memory device 3500 may be a non-volatile memory and include a memory string described above in reference to FIGS. 1 to 2D. In addition, the memory device 3500 may be configured to include a stacked structure including conductive layers and insulating layers alternately stacked, a strained channel layer passing through the stacked structure, a stressor layer contacting the strained channel layer and applying tensile stress to the strained channel layer, and a core layer formed in the stressor layer. The structure and the manufacturing method of the memory device 3500 are the same as the description above. Thus, a detailed description thereof will be omitted to avoid redundancy.

The computing system 3000 having such a configuration may be divided into an operating system layer performed at a high level area and a controller layer performed at a lower level area. The application 3100, the operating system 3200, and the file system 3300 may be included in the operation system layer, and driven by an operation memory of the computing system 3000. In addition, the translation layer 3400 may be included in the operation system layer or the controller layer.

As such, the computing system 3000 according to an embodiment of the present disclosure may include the memory device 3500 with improved integration and characteristics. Thus, the characteristics of the computing system 3000 may be improved.

The semiconductor device may include the strained channel layer with the improved electron mobility. Accordingly, a cell current of the stacked memory cells may be improved. In addition, after forming the stressor layer to directly contact the channel layer and directly applying the tensile stress from the stressor layer to the channel layer by performing the heat treatment, the strained channel layer may be easily formed.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the disclosure as set forth in the following claims.

What is claimed is:

1. A semiconductor device, comprising:
a stacked structure including conductive layers and insulating layers alternately stacked;
a strained channel layer passing through the stacked structure;
a stressor layer contacting the strained channel layer and applying stress to the strained channel layer; and
a core layer formed in the stressor layer,
wherein the strained channel layer surrounds an outer surface of the stressor layer.

2. The semiconductor device of claim 1, wherein the strained channel layer has electron mobility increased by tensile stress from the stressor layer.

3. The semiconductor device of claim 1, wherein the stressor layer includes a material in which tensile stress is induced by heat treatment of the stressor layer.

4. The semiconductor device of claim 1, wherein the stressor layer is a nitride layer.

5. The semiconductor device of claim 1, wherein the stressor layer includes a nitride and the core layer includes an oxide.

6. The semiconductor device of claim 1, wherein the strained channel layer and the stressor layer have different thermal expansion coefficients from each other.

7. The semiconductor device of claim 1, wherein the stressor layer and the strained channel layer directly contact each other, and tensile stress of the strained channel layer is induced by tensile stress of the stressor layer.

8. The semiconductor device of claim 7, wherein the outer surface of the stressor layer and an inner surface of the strained channel layer are in direct contact.

9. The semiconductor device of claim 1 further comprising a memory layer that surrounds an outer surface of the strained channel layer.

10. A semiconductor device, comprising:
a stacked structure;
a stressor layer passing through the stacked structure;
a strained channel layer surrounding an outer surface of the stressor layer and having a different thermal expansion coefficient than the stressor layer; and
a memory layer surrounding an outer surface of the strained channel layer.

11. The semiconductor device of claim 10, wherein the strained channel layer directly contacts the outer surface of the stressor layer.

12. The semiconductor device of claim 10, wherein the strained channel layer has electron mobility increased by tensile stress from the stressor layer.

13. The semiconductor device of claim 10, wherein the stacked structure includes conductive layers and insulating layers alternately stacked, and a memory layer is disposed between the strained channel layer and the conductive layers and between the strained channel layer and the insulating layers.

* * * * *